United States Patent
Yu et al.

(10) Patent No.: US 10,090,382 B1
(45) Date of Patent: Oct. 2, 2018

(54) INTEGRATED CIRCUIT STRUCTURE INCLUDING SINGLE DIFFUSION BREAK AND END ISOLATION REGION, AND METHODS OF FORMING SAME

(71) Applicant: GLOBALFOUNDRIES Inc., Grand Cayman (KY)

(72) Inventors: Hong Yu, Rexford, NY (US); Xinyuan Dou, Clifton Park, NY (US); Hui Zhan, Clifton Park, NY (US); Zhenyu Hu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/811,957

(22) Filed: Nov. 14, 2017

(51) Int. Cl.
| | |
|---|---|
| *H01L 29/06* | (2006.01) |
| *H01L 21/8234* | (2006.01) |
| *H01L 21/3213* | (2006.01) |
| *H01L 27/088* | (2006.01) |
| *H01L 27/02* | (2006.01) |
| *H01L 21/308* | (2006.01) |
| *H01L 21/762* | (2006.01) |
| *H01L 21/027* | (2006.01) |

(52) U.S. Cl.
CPC ...... *H01L 29/0649* (2013.01); *H01L 21/3081* (2013.01); *H01L 21/32139* (2013.01); *H01L 21/76224* (2013.01); *H01L 21/823431* (2013.01); *H01L 21/823481* (2013.01); *H01L 27/0207* (2013.01); *H01L 27/0886* (2013.01); *H01L 21/0276* (2013.01)

(58) Field of Classification Search
CPC combination set(s) only.
See application file for complete search history.

(56) References Cited

U.S. PATENT DOCUMENTS

| | | | |
|---|---|---|---|
| 6,383,931 B1 | 5/2002 | Flanner et al. | |
| 8,846,491 B1 | 9/2014 | Pham et al. | |
| 8,916,460 B1 | 12/2014 | Kwon et al. | |
| 9,171,752 B1 | 10/2015 | Wu et al. | |
| 9,263,516 B1 | 2/2016 | Wu et al. | |

(Continued)

OTHER PUBLICATIONS

Branislav Curanovic, "Development of a fully-depleted thin-body FinFET process", Thesis/Dissertation Collections Rochester Institute of Technoloty RIT Scholar Works, 130 pages (2003).

(Continued)

*Primary Examiner* — Mamadou Diallo
(74) *Attorney, Agent, or Firm* — Francois Pagette; Hoffman Warnick LLC

(57) ABSTRACT

The disclosure relates to forming single diffusion break (SDB) and end isolation regions in an integrated circuit (IC) structure, and resulting structures. An IC structure according to the disclosure includes: a plurality of fins positioned on a substrate; a plurality of gate structures each positioned on the plurality of fins and extending transversely across the plurality of fins; an insulator region positioned on and extending transversely across the plurality of fins between a pair of the plurality of gate structures; at least one single diffusion break (SDB) region positioned within the insulator region and one of the plurality of fins, the at least one SDB extending from an upper surface of the substrate to an upper surface of the insulator region; and an end isolation region positioned laterally adjacent to a lateral end of one of the plurality of gate structures.

20 Claims, 14 Drawing Sheets

(56) References Cited

U.S. PATENT DOCUMENTS

| | | |
|---|---|---|
| 9,337,099 B1 | 5/2016 | Jain et al. |
| 9,412,616 B1 * | 8/2016 | Xie .................. H01L 21/76224 |
| 9,425,252 B1 | 8/2016 | Zang et al. |
| 9,406,676 B2 | 9/2016 | Yu et al. |
| 9,653,579 B2 | 5/2017 | Liu et al. |
| 9,653,642 B1 | 5/2017 | Raring et al. |
| 2009/0081815 A1 | 3/2009 | Yamashita et al. |
| 2009/0242513 A1 | 10/2009 | Funk et al. |
| 2010/0036518 A1 | 2/2010 | Funk et al. |
| 2014/0001572 A1 | 1/2014 | Bohr et al. |
| 2014/0117454 A1 | 5/2014 | Liu et al. |
| 2015/0104918 A1 | 4/2015 | Liu et al. |
| 2016/0110489 A1 | 4/2016 | Schroeder et al. |
| 2016/0111524 A1 | 4/2016 | Ha et al. |
| 2016/0133632 A1 | 5/2016 | Park et al. |
| 2016/0190130 A1 | 6/2016 | Yu et al. |
| 2017/0005169 A1 * | 1/2017 | Loubet ................ H01L 29/1054 |
| 2017/0051884 A1 | 2/2017 | Raring et al. |
| 2018/0108749 A1 * | 4/2018 | Greene ............. H01L 21/76897 |

OTHER PUBLICATIONS

Chiao-Ti Huang, "Electrical and Material Properties of Strained Silicon/Relaxed Silicon Germanium Heterostructures for Single-Electron Quantum Dot Applications", A Dissertation Presented to the Faculty of Princeton University in candidacy for the Degree of Doctor of Philosophy, 127 pages (Jun. 2015).

Yu-Chih Tseng, "Interfaces and Junctins in Nanoscale Bottom-Up Semiconductor Devices", Electrical Engineering and Computer Sciences University of California at Berkeley Technical Report No. UCB-EECS-2009-65, 120 pages (May 17, 2009).

* cited by examiner

US 10,090,382 B1

INTEGRATED CIRCUIT STRUCTURE INCLUDING SINGLE DIFFUSION BREAK AND END ISOLATION REGION, AND METHODS OF FORMING SAME

BACKGROUND

Technical Field

The present application relates to methods of forming integrated circuit (IC) structures with varying isolation features, and structures associated with the disclosed methods. More particularly, the present application relates to processing techniques for creating single diffusion break (SDB) and end isolation regions in an IC structure with a reduced number of masks as compared to conventional techniques.

Related Art

Design systems are commonly used to design integrated circuits (ICs) and, in particular, to design front end of line (FEOL) components. As advances occur, smaller widths for wires and vias are provided. Additional design constrains imposed by smaller wire and via widths, e.g., requirements for uni-directional wiring at any metal layer, may preclude the use of non-linear wiring in a metal layer. The intended circuit structure must comply with these design rules before manufacture. Design rule spacing constraints can limit a variety of attributes, e.g., the maximum separation distance between adjacent gates in a cell array. Such constraints can affect the ability to form functional elements which connect gates and/or other structures together, e.g., two or more vias connecting to nearby positions of a single device layer.

To separate the various functional components of a product from each other, it may be necessary to form one or more isolation regions between two or more conductive or semiconductor regions of the product. Some isolation regions may be positioned over different types of components, e.g., over other insulating regions or over functional components. To accommodate the different locations and types of isolation regions, it is generally necessary to fabricate a different mask for each isolation structure and include various structural features, intermediate components, etc., to protect previously-formed structures or other regions from being processed to yield additional isolation regions. The structural differences at each location where an isolation region is needed may prevent the use of a single mask to form multiple types of isolation regions in the same structure.

SUMMARY

A first aspect of the disclosure provides an integrated circuit (IC) structure, including: providing a structure including: a plurality of fins positioned on a substrate, a plurality of shallow trench isolations (STIs) each positioned laterally adjacent to one of the plurality of fins, a first gate structure and a second gate structure each extending transversely across the plurality of fins and covering the plurality of STIs, and a mask positioned on the first and second gate structures; forming a first opening and a second opening in the mask, wherein forming the first opening exposes the first gate structure above at least one of the plurality of fins, and forming the second opening exposes the second gate structure above at least one of the plurality of STIs; selectively removing a portion of the first gate structure and a length portion of the at least one of the plurality of fins below the first gate structure, within the first opening, to expose the substrate; selectively removing a portion of the second gate structure, within the second opening to expose the at least one of the plurality of STIs, wherein a lateral end of a remaining portion of the second gate structure is positioned adjacent to the second opening; forming an insulator on the exposed substrate and the exposed at least one of the plurality of STIs; and removing the mask after forming the insulator.

A second aspect of the disclosure provides a method of forming an integrated circuit (IC) structure, the method including: providing a structure including: a plurality of fins positioned on a substrate, a plurality of shallow trench isolations (STIs) each positioned laterally adjacent to one of the plurality of fins, a first gate structure and a second gate structure each extending transversely across the plurality of fins and covering the plurality of STIs, and a mask positioned on the first and second gate structures; forming a first opening in the mask to expose a portion of the first gate structure above at least one of the plurality of fins; selectively removing the portion of the first gate structure and a length portion of the at least one of the plurality of fins below the first gate structure, within the first opening to expose the substrate; forming a first insulator on the exposed substrate; forming a second opening in the mask after forming the first insulator to expose a portion of the second gate structure above one of the plurality of STIs, wherein a lateral end of a remaining portion of the second gate structure is positioned adjacent to the second opening; selectively removing the portion of the second gate structure to expose the one of the plurality of STIs; forming a second insulator on the exposed one of the plurality of STIs; and removing the mask after forming the insulator.

A third aspect of the disclosure provides an integrated circuit (IC) structure, including: a plurality of fins positioned on a substrate; a plurality of gate structures each positioned on the plurality of fins and extending transversely across the plurality of fins; an insulator region positioned on and extending transversely across the plurality of fins between a pair of the plurality of gate structures; at least one single diffusion break (SDB) positioned within the insulator region and one of the plurality of fins, the at least one SDB extending from an upper surface of the substrate to an upper surface of the insulator region; and an end isolation region positioned laterally adjacent to a lateral end of one of the plurality of gate structures.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

Figure 1:
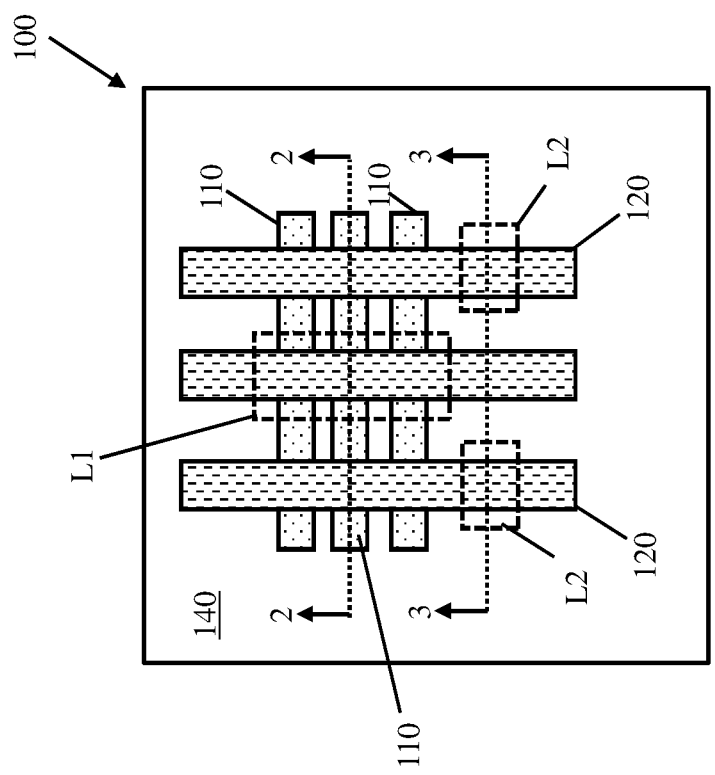
FIG. 1 shows a plan view of an initial structure to be processed according to the disclosure.

FIG. 1 provides a plan view of a structure 100 to be processed according to the present disclosure. The example structure 100 of FIG. 1 illustrates one preliminary set of materials targeted for use with embodiments of the disclosure, but it is understood that embodiments of the disclosure can be implemented on different designs without any change to the techniques discussed herein. Structure 100 can include a set (i.e., one or more) of fins 110 extending in a first direction, with three fins 110 being provided for the sake of example. Structure 100 may also include a set (i.e., one or more) gate structures 120 extending transversely over fins 110, with each gate structure 120 having one or more regions positioned over corresponding fin(s) 110 in structure 100. A shallow trench isolation 140 (shown without cross-hatching in FIG. 1 solely for clarity) of structure 100, may be positioned underneath and/or adjacent to fin(s) 110 and gate structure(s) 120. A design rule for a product may include two locations L1, L2, where gate structure(s) 120 must be removed for replacement with an electrically insulative material, e.g., a diffusion break for electrically separating two portions of the same fin, or an end isolation region for laterally separating two gate structures from each other. Although a first location L1 and two second locations L2 are shown in FIG. 1 for the purposes of example, it is understood that multiple first locations L1 and/or a single second location L2 may be processed according to the disclosure without modifying or otherwise departing from the various techniques discussed herein. Further illustration of methods according to the disclosure is provided by reference to a first lateral cross-section of FIG. 1 (e.g., along line 2-2), depicted in even-numbered FIGS. 4, 6, 8, and 10, and a second lateral cross-section of FIG. 1 (e.g., along line 3-3), depicted in odd-numbered FIGS. 5, 7, 9, and 11. It should be emphasized that fins 110 are absent from structure 100 along the second lateral cross-section.

Figure 3:
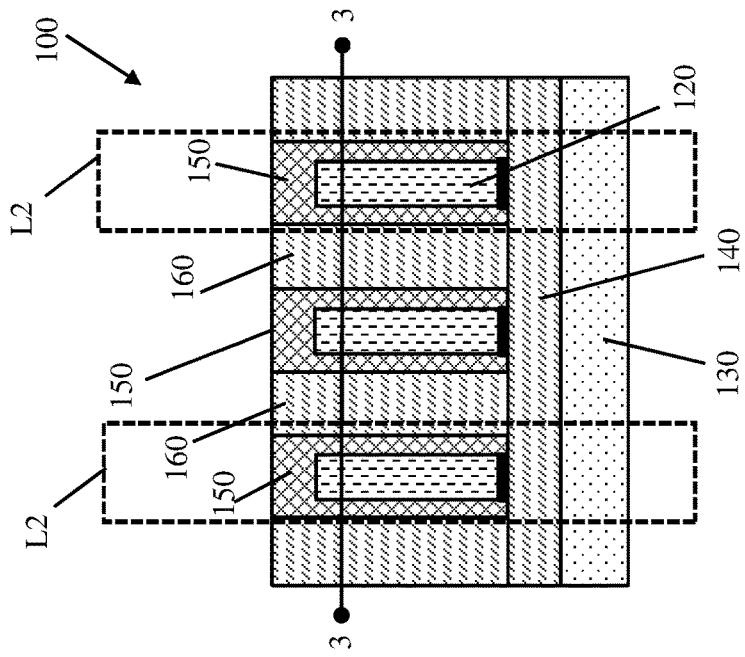
FIG. 3 shows a second lateral cross-sectional view of the structure along line 3-3 of FIG. 1 according to the disclosure.
Figure 2:
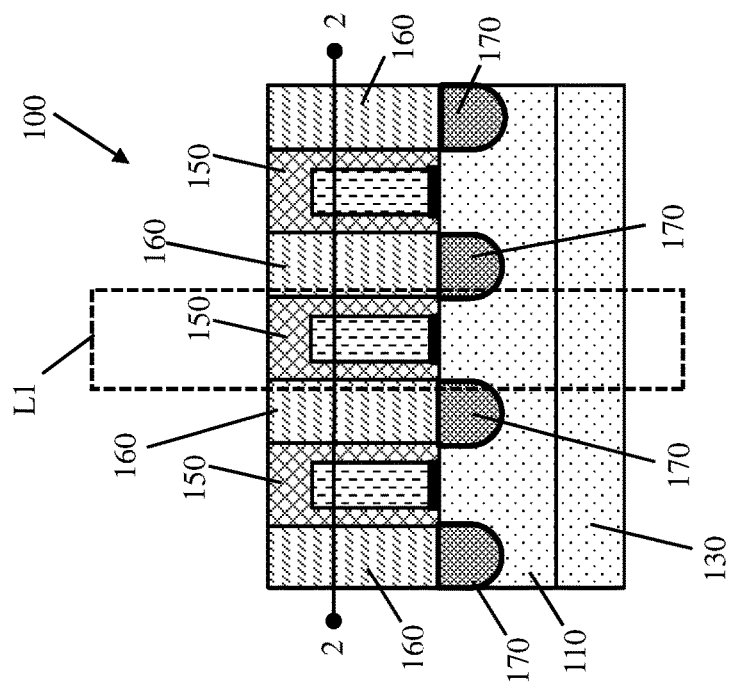
FIG. 2 shows a first lateral cross-sectional view of the structure along line 2-2 of FIG. 1 according to the disclosure.

Referring to FIGS. 2-3, together, the various components of structure 100 are discussed in further detail to better illustrate subsequent processing in embodiments of the disclosure. First and second locations L1, L2 are also depicted in FIGS. 2-3 for correspondence with FIG. 1. Each fin 110 can be formed from an underlying semiconductor substrate 130, e.g., by removing targeted portions of substrate 130 to a predetermined depth, causing the non-removed portions to form fins 110 directly on substrate 130. Substrate 130 can include, e.g., one or more currently-known or later developed semiconductive substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Structure 100 may include at least one shallow trench isolation (STI) 140 positioned on substrate 130, as well as between fins 110 and gate structures 120. Each STI 140 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Each gate structure 120 may lack one or more functional components used in a complete IC structure, and may include one or more dummy gates to be processed at a different stage of forming a product. Such components may be eventually replaced with functional elements in other process steps. Gate structures 120 thus may cover one or more semiconductor fins 110 positioned above substrate 130, e.g., by coating exposed sidewalls and an upper surface of fin(s) 110. Gate structure(s) 120 can also include corresponding gate spacers 150. Gate spacer(s) 150 can be provided as one or more bodies of insulating material formed on exposed portions of STI(s) 140 and/or gate structure(s) 120, e.g., by deposition, thermal growth, etc., and may include materials and/or other structures formed on or adjacent to gate structure(s) 120 to electrically and physically insulate gate structure(s) 120 from other components of structure 100. In an example embodiment, gate spacer(s) 150 can be provided as a region of silicon nitride (SiN) with or without other insulating materials being included therein. The lateral space between gate spacer(s) 150 in structure 100 can be occupied by one or more inter-level dielectric (ILD) regions 160, which may include the same insulating material as STI(s) 140 or may include a different electrically insulative material. STI(s) 140 and ILD region 160 nonetheless constitute different components, e.g., due to STI(s) 140 being formed before gate structure(s) 120, and ILD region 160 being formed on fin(s) 110, gate structure(s) 120, and STI(s) 140 together.

As shown specifically in FIG. 2, each fin 110 can include a set of epitaxial regions 170 positioned below ILD regions 160 and adjacent to gate structures 120. Epitaxial regions 170 may be formed within fin 110, e.g., by forming openings within fin 110 and epitaxially growing another semiconductor material within the openings, thereby forming epitaxial regions 170 with a different material composition from the remainder of fin 110. Gate structures 120 and their spacers 150 may shield a portion of the fin 110 when epitaxial regions 170 are being formed. Epitaxial regions 170 may initially include the same semiconductor material of fin 110, or a different semiconductor material before being implanted with dopants. Implanting dopants into epitaxial regions 170 may form the eventual source/drain regions of a device formed from structure 100. Epitaxial regions 170, after being implanted with dopants, may have a different composition from the remainder of fin 110. To form epitaxial regions 170, selected portions of fin 110 may be implanted with a strain-inducing material, such as silicon germanium or silicon carbon, formed on fins composed of silicon, silicon germanium, and/or silicon carbon. The dopants used to form epitaxial regions 170 may be doped in situ or an implantation process may be performed to affect only epitaxial regions 170 of structure 100. According to an example, fin 110 is not previously doped before epitaxial regions 170 are formed within structure 100. A dopant implantation process may be performed to dope both fin(s) 110 and epitaxial regions 170. If a lightly doped source/drain region is desired, the dopant implantation can occur after forming gate structures 120, but before forming spacer(s) 150.

Figures 4, 5:
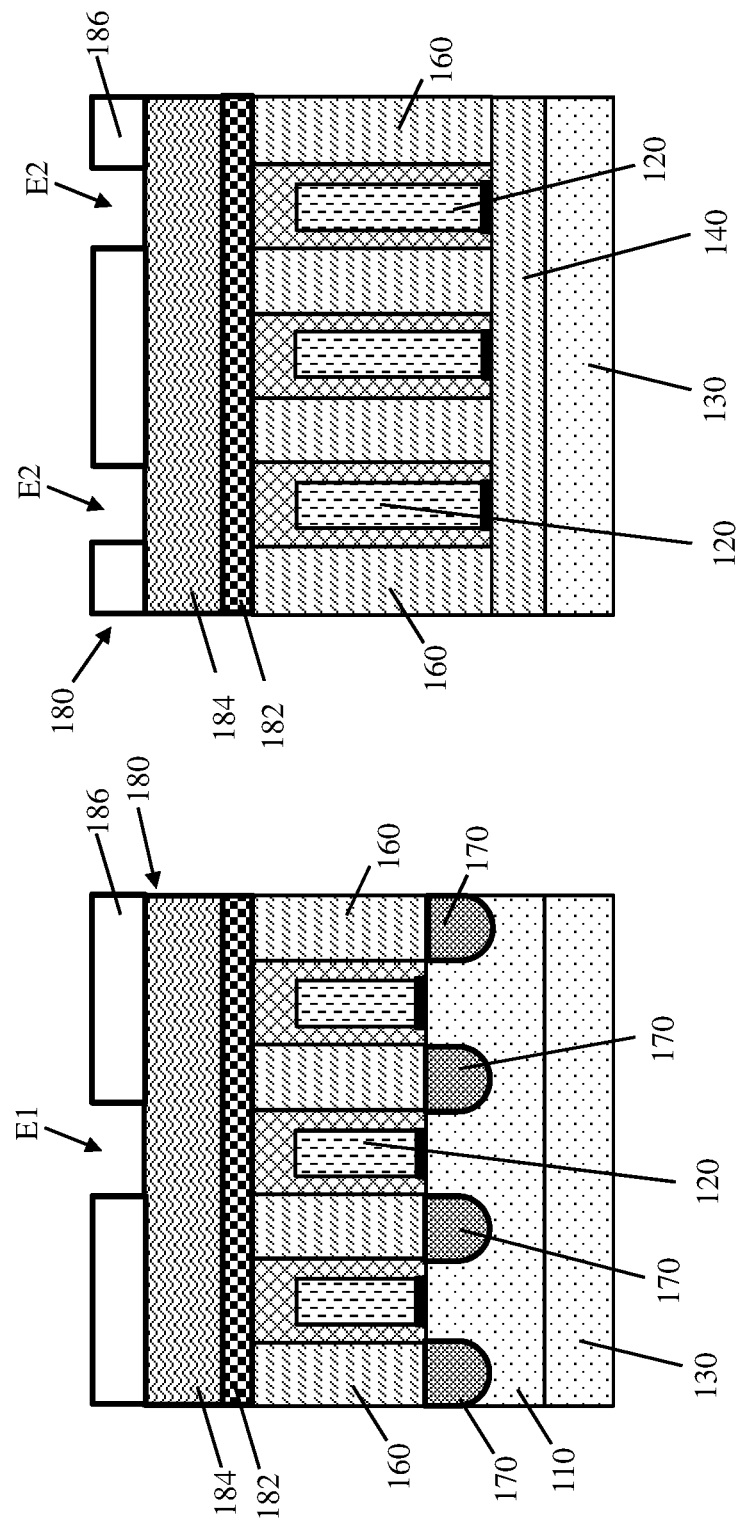
FIG. 4 shows, along the first lateral cross-section, forming a mask on the structure according to the disclosure.
FIG. 5 shows, along the second lateral cross-section, forming a mask on the structure according to the disclosure.

Turning to FIGS. 4 and 5, targeted gate structure(s) 120 may need to be removed and replaced with new materials to provide the various regions of insulative material, e.g., one or more single diffusion breaks and/or end isolation regions. Removing one or more gate structure(s) 120 can also uncover underlying structures targeted for removal (e.g., fin(s) 110, STI(s) 140, etc.) as described herein. To target one or more gate structure(s) 120 of structure 100 for removal, the disclosure may include forming a mask 180 on the upper surface of structure 100, e.g., by depositing one or more layers of masking materials. Mask 180 may include multiple layers of material as described herein. Mask 180 can include, e.g., a masking layer 182 composed of one or more currently known or later developed masking materials adapted for use in targeted etching. According to an example, masking layer 182 may include one or more nitride insulators, e.g., silicon nitride (SiN) or other materials with similar properties. Masking layer 182 can be formed before other portions of mask 180, e.g., by deposition on structure 100.

Continued fabrication of mask 180 may include forming an anti-reflective coating 184 on masking layer 182. The composition of anti-reflective coating 184 may include any currently known or later developed substance selected for permitting light passage therethrough, and/or for allowing additional anti-reflective films to be formed thereon. Examples of such materials suitable for anti-reflective coating 182 may include, e.g., a silicon-containing antireflective coating (SiARC), a silicon oxynitride (SiON) material, one or more bottom anti-reflective coatings (BARC), a low temperature oxide (LTO) material, and/or other masking materials. Masking layer 182 and anti-reflective coating 184 may together define the composition of mask 180, or mask 180 may include masking layer 182 and/or other masking materials for lithographic processing in alternative embodiments.

Mask 180 may further include a photoresist layer 186 positioned on anti-reflective coating 184. The term "photoresist layer" or "photoresist material," as used herein, refers to any currently known or later developed photo-sensitive material used in photolithography to transfer a pattern from a mask onto a wafer. Photoresist materials may include liquids deposited on the surface of the wafer as a thin film, which is then solidified by low temperature anneal. Photoresist layer 184 may be used to pattern underlying portions of mask 180 (e.g., hard mask 182 and/or antireflective coating 184) from their initial form in order to uncover and target some gate structures 120 for additional processing. As shown, photoresist layer 186 may be formed to include a first opening E1 positioned over gate structure(s) 120 overlying fin(s) 110, and a second opening E2 positioned over gate structure(s) 120 overlying STI(s) 140. Each opening E1, E2 may have a similar lateral width or different lateral width based on the size underlying materials to be removed. According to an example, each opening E1, E2 in photoresist layer 184 may have a width of at most approximately three nanometers (nm). It is noted that opening E1 may be formed distal to second opening E2 along the length of one or more gate structure(s) 120, thereby causing each opening E1, E2 in photoresist layer 186 to be positioned over a different component and/or cross-sectional structure as indicated in FIGS. 4 and 5.

Figure 7:
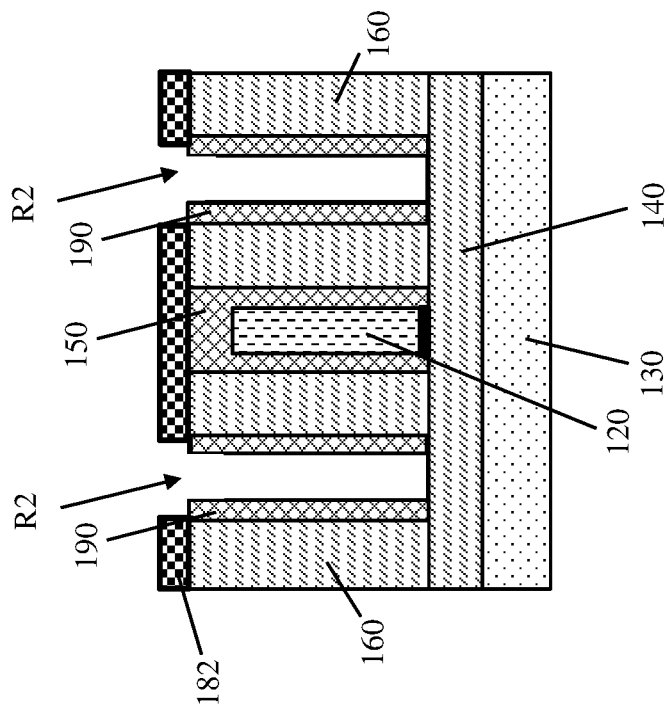
FIG. 7 shows, along the second lateral cross-section, forming second openings above a shallow trench isolation (STI) according to the disclosure.
Figure 6:
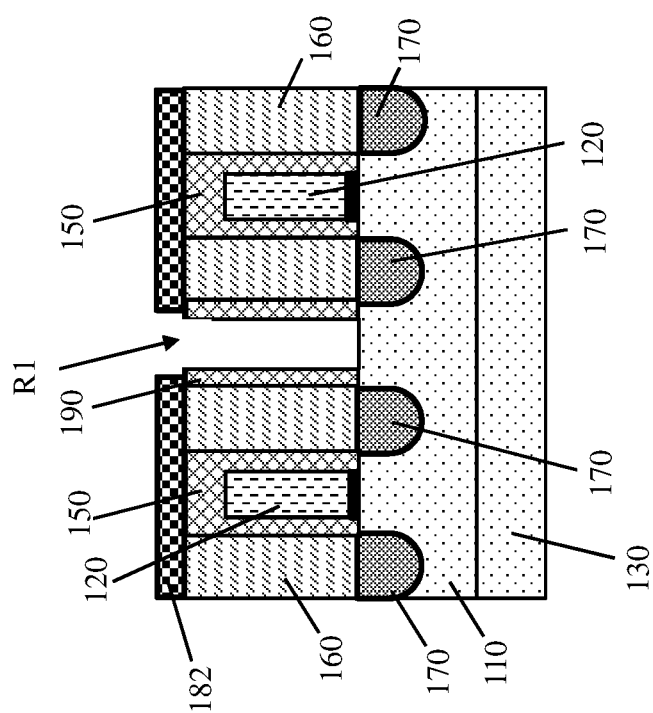
FIG. 6 shows, along the first lateral cross-section, forming a first opening above a fin according to the disclosure.

FIGS. 6 and 7 depict the etching of mask 180 to remove gate structure(s) 120 positioned below each opening E1, E2 in photoresist layer 186. Removing gate spacer 120 beneath opening E1 may expose an underlying portion of fin(s) 110, while removing gate structure(s) 120 beneath opening E2 in photoresist layer 186 may expose an underlying portion of STI(s) 140. The materials removed beneath first opening E1 may form a first opening R1 in mask 180, while the materials removed beneath second opening E2 may form a second opening R2 in mask 180. Other gate structures 120 covered by at least hard mask 182 may remain intact as other gate structures 120 are removed. After gate structures 120 have been removed to form openings R1, R2, photoresist layer 186 (FIGS. 4, 5) and other portions of mask 180 (e.g., anti-reflective coating 182 (FIGS. 4, 5) can be removed by stripping and/or other selective removal techniques. Hard mask 182 can remain intact on the upper surface of insulators 162 and non-targeted gate structures 120 to protect these materials from being removed, modified, etc., during subsequent modification of the components within openings R1, R2. As shown by example, some portions of gate spacer(s) 150 (FIGS. 2-5) may remain intact after gate structure(s) 120 have been removed, e.g., due to differences in the etch selectivity of gate spacer(s) 150. The remaining spacer materials may remain intact as a spacer liner 190 on the sidewalls of each opening R1, R2. It is also understood that gate spacer(s) 150 may be completely removed with gate structure(s) 120 in further embodiments.

Figure 9:
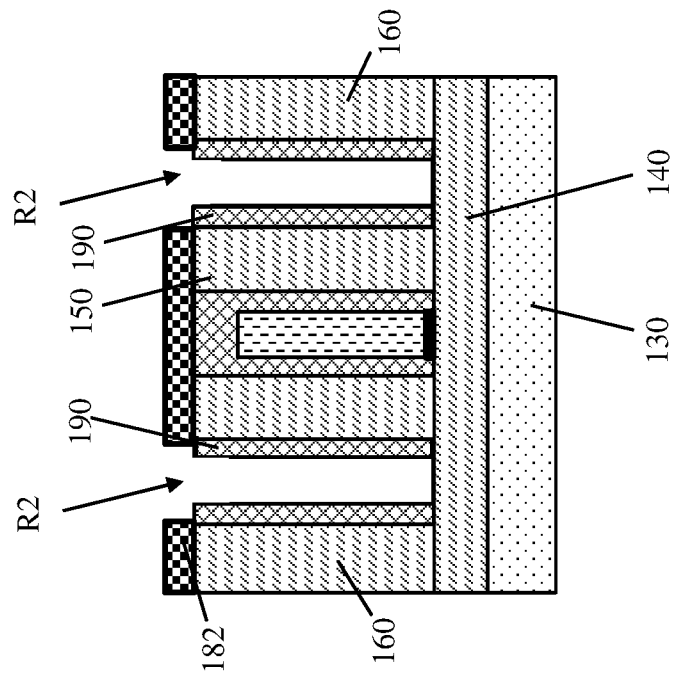
FIG. 9 shows, along the second lateral cross-section, the removing of the portion of the fin according to the disclosure.
Figure 8:
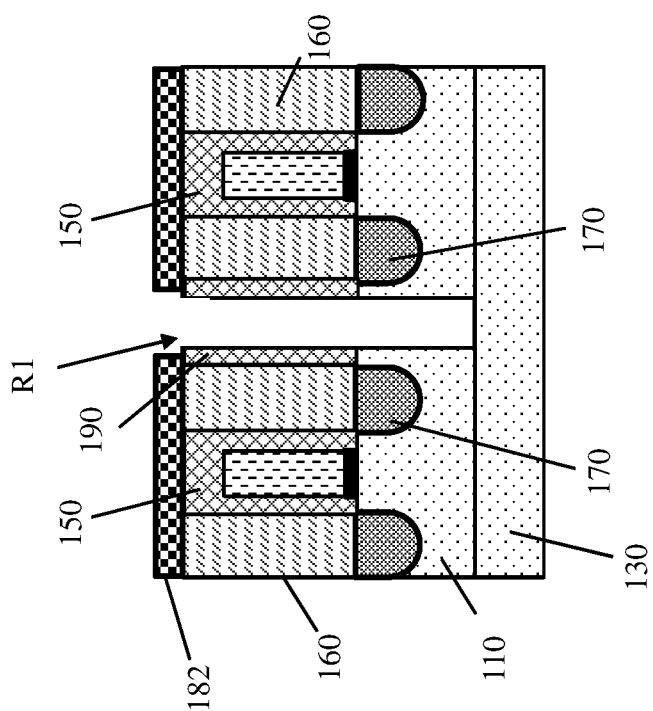
FIG. 8 shows, along the first lateral cross-section, removing a portion of a fin to expose an underlying substrate according to the disclosure.

To form an SDB region in an IC structure, a length portion of one or more fins 110 may be removed and filled with one or more insulating materials. FIGS. 8 and 9 illustrate a process for removing a portion of fin 110 without affecting other portions of the structure, including the previously formed second opening(s) R2 over STI(s) 140. At this stage, a selective vertical etching of the structure can remove exposed semiconductor material from fin(s) 110 within first opening R1. The removed portions of fin(s) 110 may coincide with a length portion of each fin previously covered by a corresponding gate structure, e.g., as shown on three fins 110 at location L1 in FIG. 1. The selective vertical etching of fin 110 may increase the depth of first opening R1 below the upper surface of insulator(s) 160, and thus may expose an underlying portion of substrate 130. Applying an etchant selective to semiconductor materials may cause second opening(s) R2, including spacer liners 190 and STI(s) 140 therein, to remain in substantially the same form (i.e., with a negligible amount of materials removed) as semiconductive material is removed from fin(s) 110. In some cases, selectively removing a portions of fin(s) 110 can occur during the same etching process for removing gate structure(s) 120, while the processes may be independent in other embodiments. However implemented, the combination of elective etching with the forming of a mask and two openings in earlier processing, allows each of the formed openings R1, R2 to have a distinct structure. Opening(s) R1, in particular, are structured for creating an SDB region on substrate 130 by extending into the removed portions of fin(s) 110. Opening(s) R2 by contrast are structured for creating an end isolation region on STI(s) 140, e.g., by being positioned over STI(s) 140 and distal to fin(s) 110.

Figure 11:
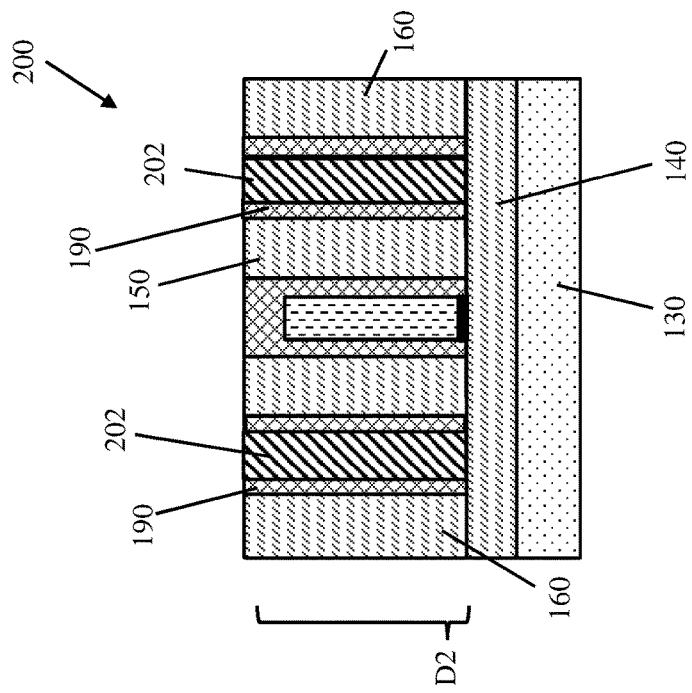
FIG. 11 shows, along the second lateral cross-section, forming an insulator in the second openings according to the disclosure.
Figure 10:
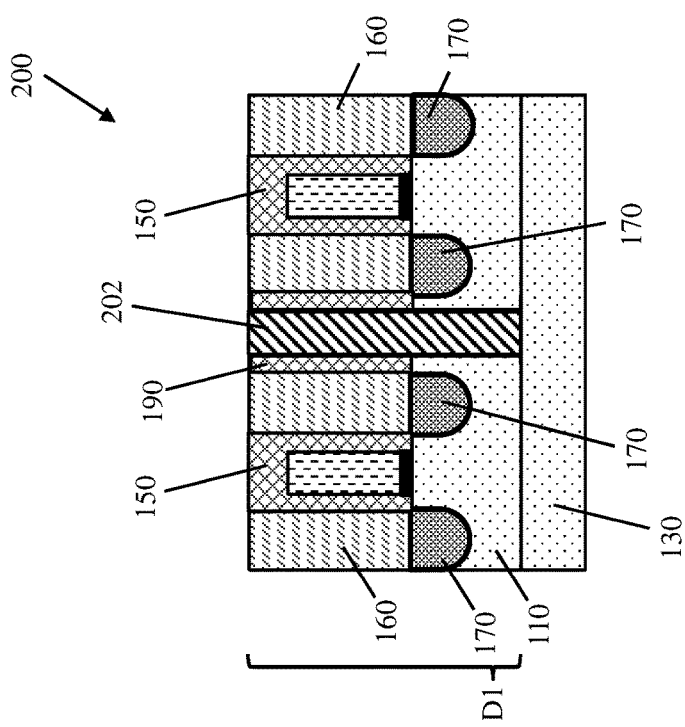
FIG. 10 shows, along the first lateral cross-section, forming an insulator in the first openings according to the disclosure.

FIGS. 10 and 11 depict the filling of opening(s) R1, R2 (FIGS. 4-9) with insulating materials to yield an IC structure 200 according to the present disclosure. According to an embodiment, each opening R1, R2 may be filled with an insulator 202 composed of, e.g., one or more insulative materials included in insulative region(s) 160 or a different insulating material. Insulator 202 is shown with different cross-hatching from insulative region(s) 160 solely for emphasis, and in a particular example may include one or more nitride insulators appropriate for use within hard mask 182 (FIGS. 2-9). Insulator 202 may additionally or alternatively include an oxide-based insulator and/or other materials configured to inhibit or prevent the transmission of electric currents therethrough.

Insulator 202 may be formed by way of non-selective or selective deposition to fill opening(s) R1, R2 (FIGS. 4-9), and in some cases may cause insulator 202 to be formed above gate structure(s) 120, insulative region(s) 160, and/or remaining portions of hard mask 182 after filling opening(s) R1, R2. Insulator 202 can thus be positioned on substrate 130 within opening(s) R1, and on STI(s) 140 within opening(s) R2. FIGS. 10 and 11 also depict, e.g., removing hard mask 182 and/or other materials from the upper surface of above gate structure(s) 120 and/or insulative region(s) 160 after insulator 202 is formed. For instance, methods according to the disclosure may include applying chemical mechanical planarization (CMP) to structure 200 to remove any materials positioned above gate structure(s) 120, insulative region(s) 160, etc. In alternative embodiments, some portions of insulator 202 above structure 200 may remain intact, in order to be used in other processes and/or to form part of ILD region(s) 160 in the structure of a device.

Figure 12:
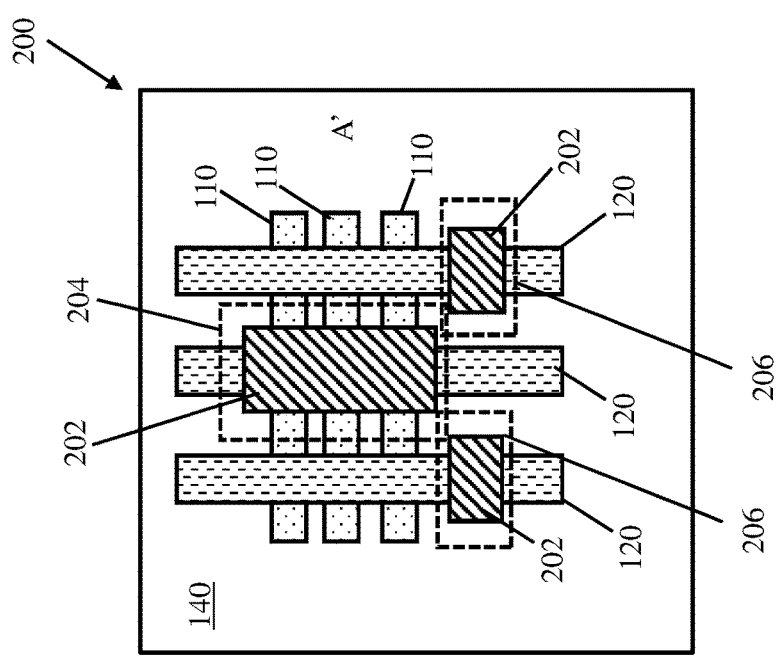
FIG. 12 shows a plan view of an IC structure according to the disclosure.

Referring to FIGS. 10-12 together, the various processes described herein may provide various structural and functional advantages in the realm of product design and manufacture. For instance, insulator 202 positioned above substrate 130 (FIG. 10) and above STI(s) 140 (FIG. 11) may be formed from the same material as a result of being fabricated through the same deposition. By contrast, conventional processing may require multiple masks and/or depositions to form insulative materials at similar locations, and thus may produce insulators with different compositions and/or other structural attributes related to the different deposition times. As also shown in FIGS. 10 and 11, insulator 202 may extend to a depth D1 through fin(s) 110 and insulative region(s) 160 above substrate 130, while extending to a reduced depth D2 through insulative region(s) 160 above STI(s) 140. The difference in depth for the same insulator 202 may stem from the prior selective etching of fin(s) 110 to increase the size of first opening(s) R1 (FIGS. 4-9).

Although insulator 202 may be formed through a single deposition, each portion of insulator 202 may serve a different purpose in IC structure 200. For example, as shown specifically in FIG. 12, portions of insulator 202 positioned on and within fin(s) 110 may form a single diffusion break (SDB) region 204 within structure 200, e.g., to electrically separate two semiconductor regions of one fin 110 from each other. Other portions of insulator 204 not positioned over and within fin(s) 110, e.g., above STI(s) 140, may form end isolation regions 206 positioned at a lateral end of the remainder of gate structure(s) 120. End isolation regions 206 therefore may be structured to divide gate structure(s) 120 into laterally distinct regions, each isolated from each other by insulator 202 within end isolation region(s) 206. During a subsequent process for replacing gate structure(s) 120 with electrically functional gates and/or other components, end isolation region(s) 206 may continue to structurally and electrically separate the replacement components from each other. Thus, methods according to the disclosure provide a unified process of forming SDB regions 204 and end isolation regions 206 with a single mask, and with a single implementation of the various etching and deposition processes described herein. Again, it is noted that the number of SDB regions 204 and end isolation regions 206 may vary between implementations, and that insulator 202 may be deposited to form only a single SDB region 204 or end isolation region 206, as well as multiple SDB regions 204 or end isolation regions 206 to suit different products and/or intended functions.

Figures 13, 14:
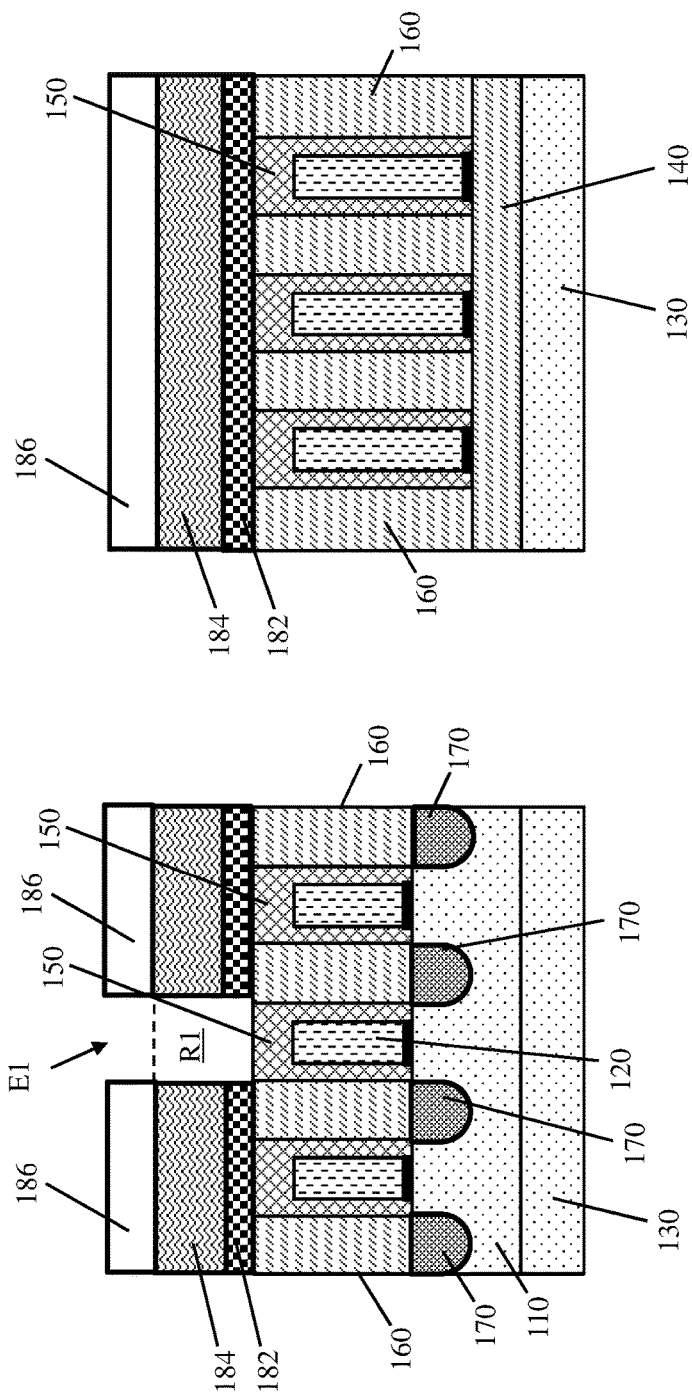
FIG. 13 shows, along the first lateral cross-section, forming a mask on a structure according to further embodiments of the disclosure.
FIG. 14 shows, along the second lateral cross-section, forming a mask on a structure according to further embodiments of the disclosure.

Referring now to FIGS. 13 and 14 in conjunction with FIGS. 2 and 3, it may be desirable in further implementations to form SDB regions and end isolation regions of a structure in a sequential fashion and/or with different material compositions. Methodologies of the present disclosure can be implemented in the same form, or a modified form, to accommodate this scenario. FIGS. 13 and 14, for example, mask 180 with hard mask 182 and anti-reflective coating 184 may be formed with photoresist layer 186 thereon, and etched to form one or more first openings E1 (FIG. 13 only) positioned over gate structure(s) 120. Similar to other processes discussed herein, first opening(s) E1 may have a lateral width of at most approximately three nanometers. However, photoresist layer 186 in a modified form may only include first opening(s) E1, thereby protecting each gate structure 120 above STI(s) 140 from being modified, removed, etc., during this stage of the methodology. The portions of mask exposed within first opening(s) E1 can be removed to form a first opening R1 within mask 180, and positioned below photoresist layer 186. Thus, forming only first opening(s) R1 in mask 180 to expose gate structure(s) 120 above fin(s) 110 can allow other openings to be separately formed in different locations (e.g., above STI(s) 140) during other processes.

Figure 16:
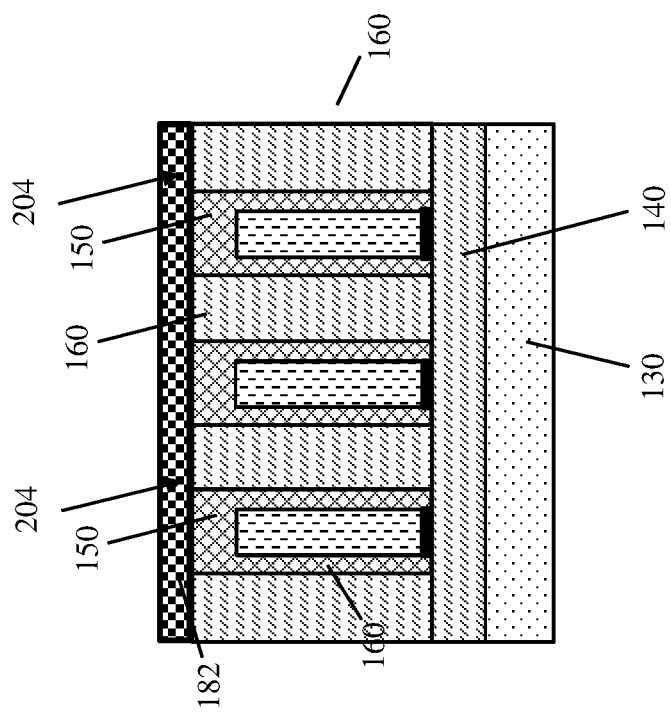
FIG. 16 shows, along the second lateral cross-section, the removing of a portion of the fin according to embodiments of the disclosure.
Figure 15:
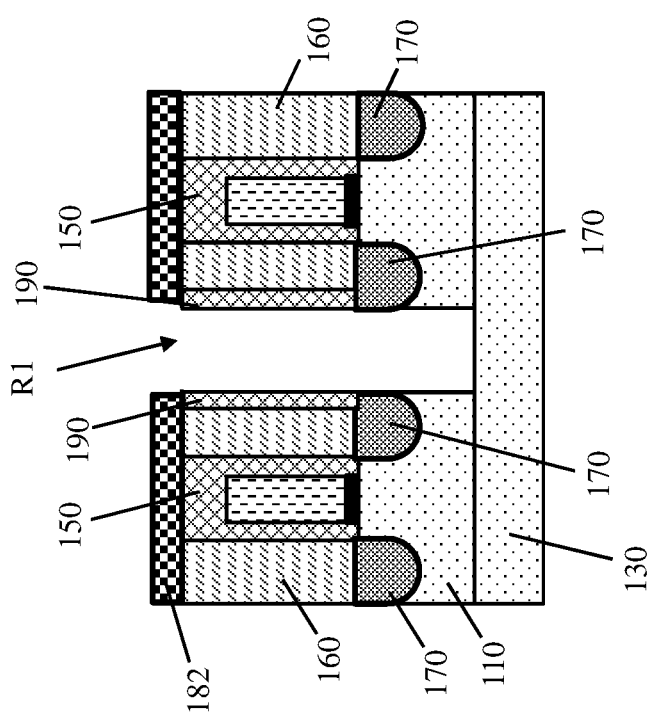
FIG. 15 shows, along the first lateral cross-section, removing a portion of the fin according to embodiments of the disclosure.

Turning to FIGS. 15 and 16, continued processing of the structure may include removing and etching the exposed gate structure(s) 120 and underlying portions of fin(s) 110 substantially in accordance with other techniques described herein, e.g., the removing processes illustrated in FIGS. 6-9. As noted elsewhere herein, remaining portions of gate spacer(s) 150 within first opening(s) R1 may form spacer liner(s) 190 on opposing sidewalls of first opening(s) R1. However, as shown in FIGS. 15 and 16, each gate structure 120 and portion of ILD region 160 beneath hard mask 182 may remain substantially intact as materials within first opening(s) R1 are being removed. Following the removal gate structure(s) 120 and underlying portions of fin(s) 110 within first opening R1, an upper surface of substrate 130 may be exposed.

Figure 18:
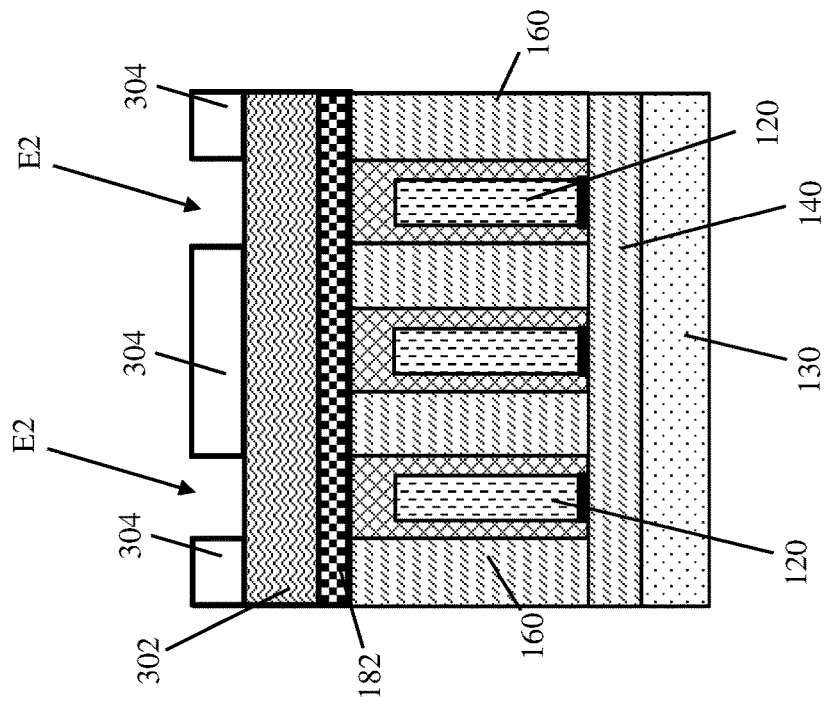
FIG. 18 shows, along the second lateral cross-section, forming the insulator and another mask according to the disclosure.
Figure 17:
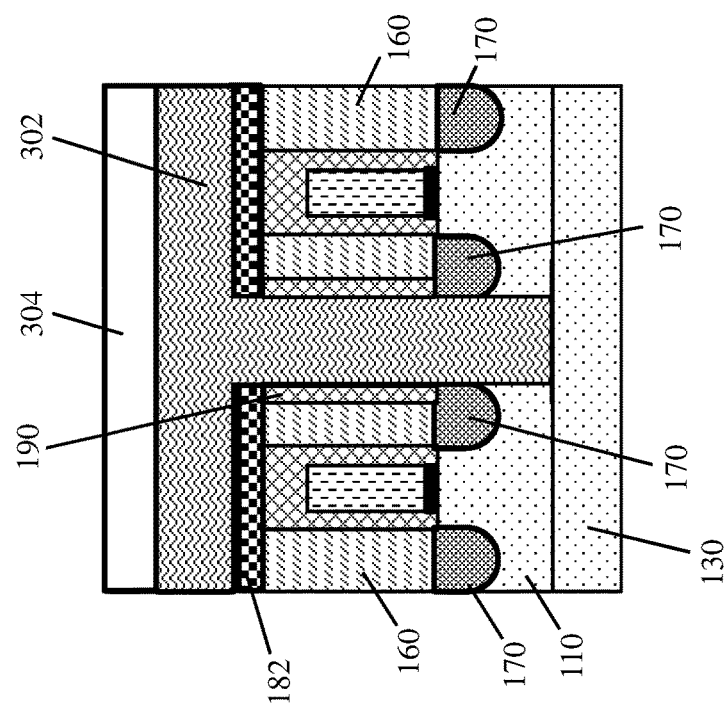
FIG. 17 shows, along the first lateral cross-section, forming an insulator in the removed portions of the fin and forming another mask according to the disclosure.

Referring now to FIGS. 17 and 18, continued processing according to the disclosure may include depositing, e.g., a first insulator 302 to fill first opening R1, and at least partially covering hard mask 182 positioned on gate structure(s) 120 and ILD region(s) 160. As discussed elsewhere herein, first insulator 302 may include one or more nitride insulators or other insulating materials configured to operate as an SDB region in an IC product. In contrast to other processes described herein, first insulator 302 may not be positioned beneath hard mask 182 in the second cross section depicted in FIG. 18, and thus may not be in contact with any portion of STI(s) 140. Subsequent to forming first insulator 302, another photoresist layer 304 may be formed on the upper surface of first insulator 302 and patterned to create one or more second opening(s) E2 (FIG. 18 only). Second opening(s) E2, in some instances, may have a width of at most approximately three nanometers, and more specifically may have the same lateral width or a different lateral width from that of first opening(s) E1 formed in photoresist layer 186 (FIG. 13). Second opening(s) E2 in photoresist layer 304 may be positioned over portions of hard mask 182 and first insulator 302 in the second cross-section depicted in FIG. 18. More particularly, second opening(s) E2 can be positioned above gate structure(s) 12 which cover STI(s) 140. The position of second opening(s) R2 within photoresist layer 304 thus can target different gate structure(s) 120 for separate removal and replacement with insulating materials.

Figure 20:
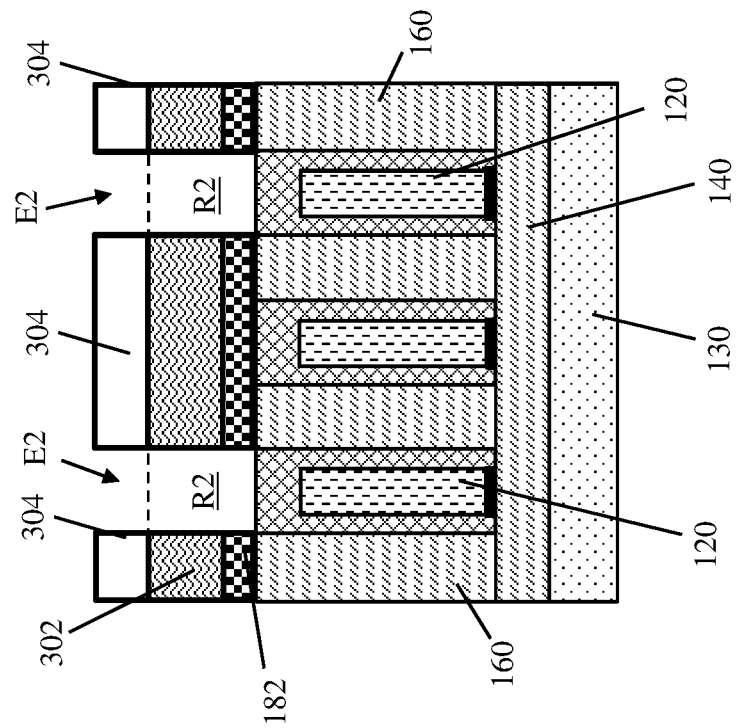
FIG. 20 shows, along the second lateral cross-section, forming second openings in the mask according to the disclosure.
Figure 19:
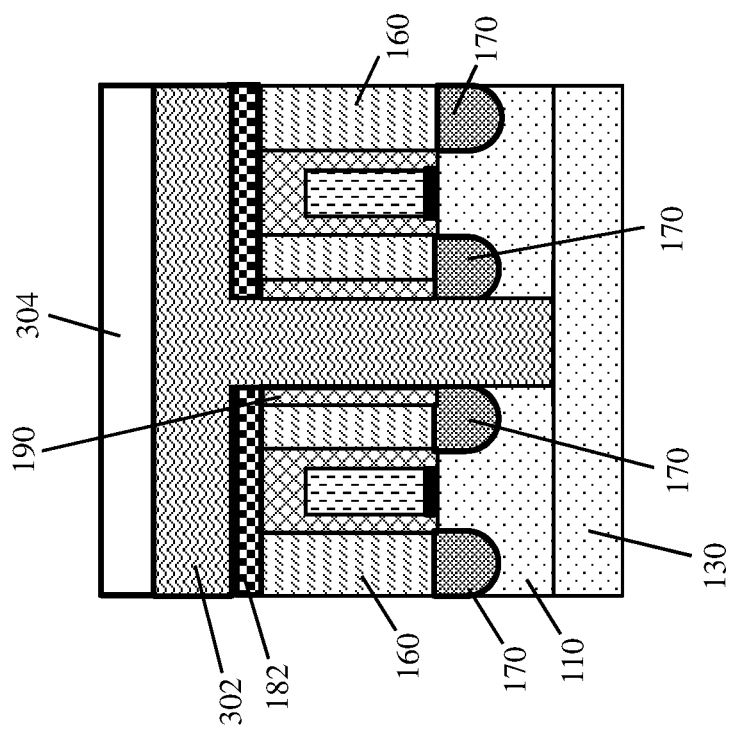
FIG. 19 shows, along the first lateral cross-section, forming second openings in the mask according to the disclosure.

Proceeding to FIGS. 19 and 20, portions of first insulator 302 and hard mask 182 below second opening(s) E2 of photoresist layer 304 may be removed by a selective or non-selective vertical etching to expose gate structure(s) 120 thereunder. The etching below second opening(s) E2 of photoresist layer 304 can form second openings R2 within first insulator 302 and hard mask 182. The lack of openings in photoresist layer 304 above fin(s) 110 may protect the previously etched and filled openings from being further modified when other regions of the structure are being processed to form additional insulative materials. Furthermore, it is noted that hard mask 182 is not replaced during the forming and processing of second opening(s) R2, in contrast to conventional techniques which may rely on forming additional hard masks, antireflective films, etc.

Figure 22:
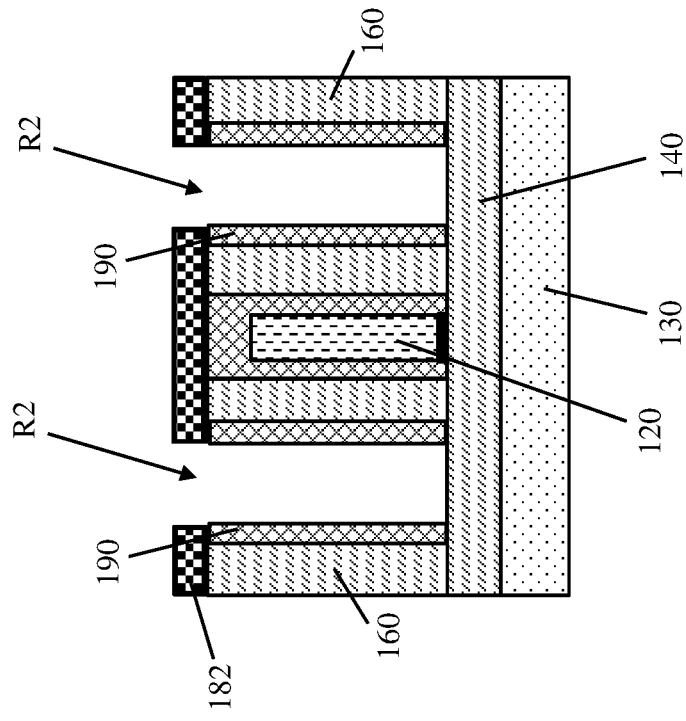
FIG. 22 shows, along the second lateral cross-section, removing second gate structures according to the disclosure.
Figure 21:
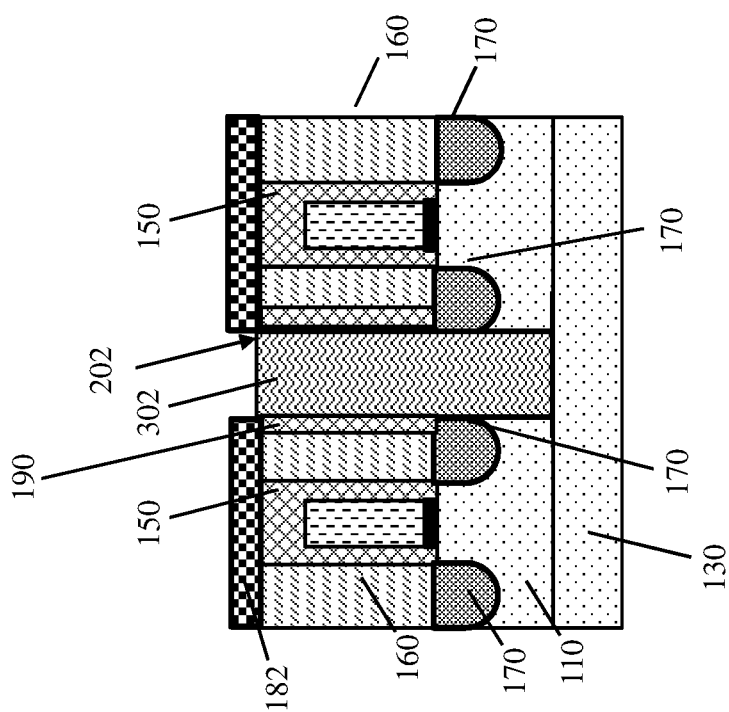
FIG. 21 shows, along the first lateral cross-section, removing second gate structures according to the disclosure.

Referring now to FIGS. 21 and 22, the disclosure may include removing gate structure(s) 120 (FIGS. 14, 16, 18, 20) positioned over STI(s) 140 to deepen second opening(s) R2 and expose the underlying portions of STI(s) 140. The removing of gate structure(s) 120 can be implemented by way of selective or non-selective vertical etching of the materials included in the exposed gate structure(s) 120, and may yield gate liner(s) 190 on opposite sidewalls of second opening(s) R2 in some implementations. The removing of gate structure(s) 120 can accompany one or more processes for removing the overlying portions of first insulator 302 and photoresist layer 304, e.g., etching, stripping, planarization, etc. However, any processes used to remove first insulator 302 may be controlled such that at least a portion of first insulator 302 remains intact above fin(s) 110.

Figures 23, 24:
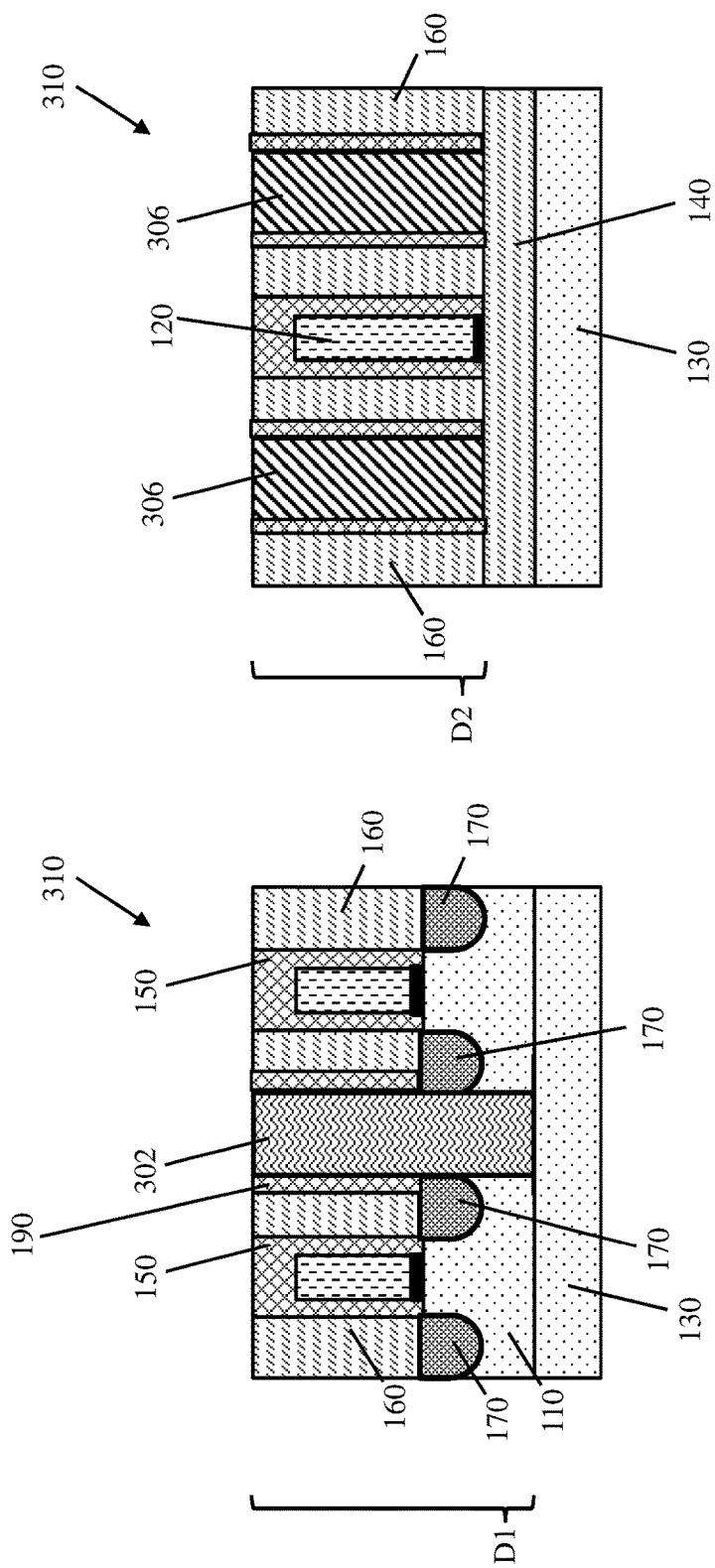
FIG. 23 shows, along the first lateral cross-section, forming another insulator according to the disclosure.
FIG. 24 shows, along the second lateral cross-section, forming another insulator within the second openings according to the disclosure.
Figure 25:
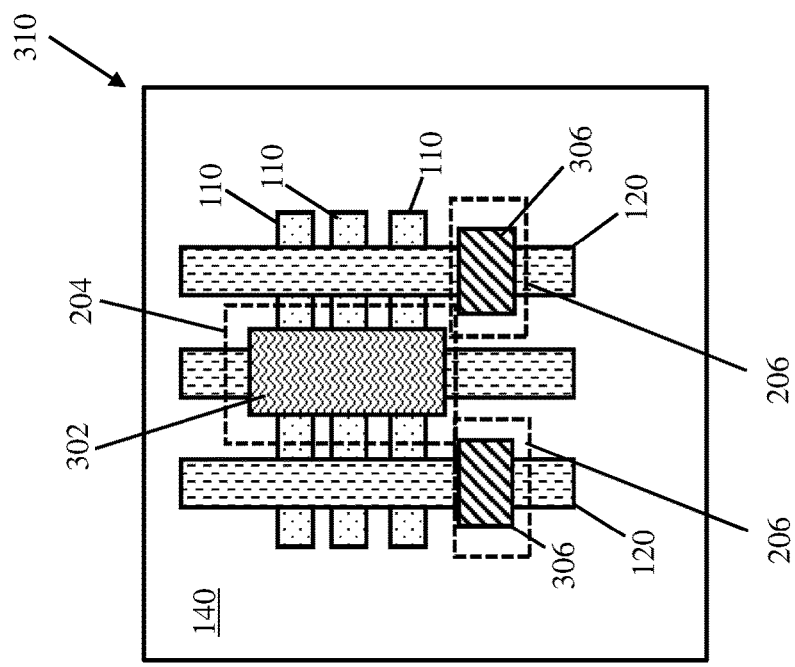
FIG. 25 shows a plan view of an IC structure according to the disclosure.

Turning to FIGS. 23-25, subsequent processing may include filling second openings R2 (FIGS. 18, 20, 22) with a second insulator 306 (FIGS. 24 and 25 only) to form an IC structure 310 according to the disclosure. Second insulator 306 may be composed of one or more of the same materials included within first insulator 302, and/or may be formed of a different insulating material to accommodate different design specifications. Thus, second insulator 306 is illustrated in FIGS. 24 and 25 with different cross-hatching from first insulator 302 to emphasize the possibility of different material compositions within each insulator 302, 306. After second insulator 306 is formed, hard mask 182 may be removed in substantially the same manner as other processes discussed herein, e.g., by stripping, selective etching, non-selective etching, CMP, etc. The resulting IC structure 310 thus may include SDB region(s) 204 (FIG. 25 only) in the form of first insulator 302, and end isolation region(s) 206 (FIG. 25 only) in the form of second insulator 306. Although being functionally equivalent to embodiments of IC structure 200 (FIGS. 10-12) discussed elsewhere herein, the modified fabrication techniques associated with IC structure 310 may allow different insulator materials to be included within each region 204, 206, to provide different amounts of electrical insulation and/or other operational characteristics.

Regardless of whether regions 204, 206 include different types of insulators therein, their relative positions and sizes in IC structure 310 may be the same as in IC structure 200. For example, first insulator 302 may extend to depth D1 (FIG. 23 only) through fin(s) 110 and insulative region(s) 160 above substrate 130. Second insulator 306 by comparison may extend to a reduced depth D2 (FIG. 24 only) through insulative region(s) 160 above STI(s) 140. The differences in depth may stem from the prior selective etching of fin(s) 110 to increase the size of first opening(s) R1 (FIGS. 13, 15). In addition, as emphasized in FIG. 25, SDB region(s) 204 may be laterally distal to end isolation region(s) 206 along the length of the remaining gate structure(s) 120 within IC structure 310. Regardless of differences in the process of forming first and second insulators 302, 306, the number of SDB regions 204 and end isolation regions 206 may vary between implementations, such that first insulator 302 may be deposited to form one or more SDB regions 204. Second insulator 306 similarly may be used to form a single end isolation region 206 or multiple end isolation regions 206 to suit different products and/or intended functions.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) structure, the method comprising:
    providing a structure including:
        a plurality of fins positioned on a substrate,
        a plurality of shallow trench isolations (STIs) each positioned laterally adjacent to one of the plurality of fins,
        a first gate structure and a second gate structure each extending transversely across the plurality of fins and covering the plurality of STIs, and
        a mask positioned on the first and second gate structures;
    forming a first opening and a second opening in the mask, wherein forming the first opening exposes the first gate structure above at least one of the plurality of fins, and forming the second opening exposes the second gate structure above at least one of the plurality of STIs;
    selectively removing a portion of the first gate structure and a length portion of the at least one of the plurality of fins below the first gate structure, within the first opening, to expose the substrate;
    selectively removing a portion of the second gate structure, within the second opening to expose the at least one of the plurality of STIs, wherein a lateral end of a remaining portion of the second gate structure is positioned adjacent to the second opening;
    forming an insulator on the exposed substrate and the exposed at least one of the plurality of STIs; and
    removing the mask after forming the insulator.

2. The method of claim 1, wherein selectively removing the portion of the first gate structure further includes removing a portion of each of the plurality of fins to expose the substrate beneath each of the plurality of fins.

3. The method of claim 1, wherein a depth of the first opening below an upper surface of the remaining portion of the second gate structure is greater than a depth of the second opening below an upper surface of the remaining portion of the second gate structure.

4. The method of claim 1, wherein the second opening is distal to the first opening along a length of the second gate structure.

5. The method of claim 1, wherein forming the insulator includes filling the first and second openings with a single insulating material.

6. The method of claim 1, wherein forming the insulator on the exposed substrate forms a single diffusion break (SDB) within the one of the plurality of fins.

7. The method of claim 1, wherein forming the insulator on the exposed one of the plurality of STIs forms an end isolation region adjacent to the lateral end of the remaining portion of the second gate structure.

8. A method of forming an integrated circuit (IC) structure, the method comprising:
    providing a structure including:
        a plurality of fins positioned on a substrate,
        a plurality of shallow trench isolations (STIs) each positioned laterally adjacent to one of the plurality of fins,
        a first gate structure and a second gate structure each extending transversely across the plurality of fins and covering the plurality of STIs, and
        a mask positioned on the first and second gate structures;

forming a first opening in the mask to expose a portion of the first gate structure above at least one of the plurality of fins;

selectively removing the portion of the first gate structure and a length portion of the at least one of the plurality of fins below the first gate structure, within the first opening to expose the substrate;

forming a first insulator on the exposed substrate;

forming a second opening in the mask after forming the first insulator to expose a portion of the second gate structure above one of the plurality of STIs, wherein a lateral end of a remaining portion of the second gate structure is positioned adjacent to the second opening;

selectively removing the portion of the second gate structure to expose the one of the plurality of STIs;

forming a second insulator on the exposed one of the plurality of STIs; and removing the mask after forming the insulator.

9. The method of claim 8, wherein selectively removing the portion of the first gate structure further includes removing a portion of each of the plurality of fins to expose the substrate beneath each of the plurality of fins.

10. The method of claim 8, wherein a depth of the first opening below an upper surface of the remaining portion of the second gate structure is greater than a depth of the second opening below an upper surface of the remaining portion of the second gate structure.

11. The method of claim 8, wherein the second opening is distal to the first opening along a length of the second gate structure.

12. The method of claim 8, wherein a lateral width of the first opening or the second opening is at most approximately three nanometers (nm).

13. The method of claim 8, wherein forming the insulator on the exposed substrate forms a single diffusion break (SDB) within one of the plurality of fins.

14. The method of claim 8, wherein forming the insulator on the exposed one of the plurality of STIs forms an end isolation region adjacent to the lateral end of the remaining portion of the second gate structure.

15. An integrated circuit (IC) structure comprising:
a plurality of fins positioned on a substrate;
a plurality of gate structures each positioned on the plurality of fins and extending transversely across the plurality of fins;
an insulator region positioned on and extending transversely across the plurality of fins between a pair of the plurality of gate structures;
at least one single diffusion break (SDB) positioned within the insulator region and one of the plurality of fins, the at least one SDB extending from an upper surface of the substrate to an upper surface of the insulator region; and
an end isolation region positioned laterally adjacent to a lateral end of one of the plurality of gate structures.

16. The IC structure of claim 15, wherein the insulator region includes:
a shallow trench isolation (STI) region positioned directly on the substrate between a pair of the plurality of fins; and
an inter-layer-dielectric (ILD) region positioned on the STI region between a pair of the plurality of gate structures.

17. The IC structure of claim 15, wherein a depth of the at least one SDB relative to an upper surface of the plurality of gate structures is greater than a depth of the end isolation region relative to the upper surface of the plurality of gate structures.

18. The IC structure of claim 15, wherein the at least one SDB and the end isolation region are each composed of a single insulating material.

19. The IC structure of claim 15, wherein the at least one SDB and the end isolation region each comprise portions of a nitride insulator region, the nitride insulator region including an overlying region positioned on each of the SDB and the end isolation region.

20. The IC structure of claim 15, wherein the end isolation region is distal to the at least one SDB along a length of one of the plurality of gate structures.

* * * * *